United States Patent [19]

Murakami et al.

[11] Patent Number: 5,028,513
[45] Date of Patent: Jul. 2, 1991

[54] PROCESS FOR PRODUCING PRINTED CIRCUIT BOARD

[75] Inventors: Kanji Murakami, Mito; Mineo Kawamoto, Hitachi; Akio Tadokoro, Ibaraki; Haruo Akahoshi, Hitachi; Toshikazu Narahara, Ibaraki; Ritsuji Toba, Hadano; Toshiaki Ishimaru; Nobuyuki Hayashi, both of Hitachi; Motoyo Wajima, Yokohama, all of Japan

[73] Assignees: Hitachi, Ltd.; Hitachi Chemical Co., Ltd., both of Tokyo, Japan

[21] Appl. No.: 336,771

[22] Filed: Apr. 13, 1989

[30] Foreign Application Priority Data

Apr. 13, 1988 [JP] Japan .................. 63-89083

[51] Int. Cl.$^5$ .................................. G03C 5/00
[52] U.S. Cl. ...................... 430/315; 430/314; 430/318; 430/329; 430/330
[58] Field of Search ............... 430/315, 330, 314, 318, 430/329

[56] References Cited

U.S. PATENT DOCUMENTS

| | | | |
|---|---|---|---|
| 3,622,334 | 11/1971 | Hurley et al. | 430/281 |
| 3,854,973 | 12/1974 | Mersereau et al. | 428/528 |
| 3,873,316 | 3/1975 | Velten et al. | 430/159 |

FOREIGN PATENT DOCUMENTS 50-9177 4/1975 Japan.
61-176192 8/1986 Japan.

*Primary Examiner*—Charles L. Bowers, Jr.
*Assistant Examiner*—Ashley I. Pezzner
*Attorney, Agent, or Firm*—Antonelli, Terry, Stout & Kraus

[57] ABSTRACT

The present invention provide a process for producing printed circuit boards which comprises the steps of
(a) roughening a surface of a copper layer formed on an insulating board.
(b) coating the roughened surface of copper layer with a photo-resist layer containing a sublimable copper-corrosion inhibitor, exposing the resist layer selectively to actinic rays according to a circuit pattern to form, and developing the resulting resist layer, thereby forming plating-resist coats on circuit-negative pattern portions of the copper layer,
(c) heat-treating the plating-resist coats,
(d) plating chemically the circuit-corresponding portion with copper,
(e) removing the plating-resist coats, and
(f) removing the copper layer except the circuit-corresponding portion thereof.

21 Claims, 1 Drawing Sheet

PROCESS FOR PRODUCING PRINTED CIRCUIT BOARD

BACKGROUND OF THE INVENTION

1. FIELD OF THE INVENTION

The present invention relates to a process for producing printed circuit boards and more particularly to a process for producing printed circuit boards, for which fine, high-density patterns of circuits are required today to have.

2. DESCRIPTION OF THE PRIOR ART

Conventionally, printed circuit boards with high-density patterns of circuits, such as double-sided printed circuit boards and multilayer printed circuit boards, have been fabricated mainly in the manner that copper-clad laminates are used as starting materials, through holes electroplated with copper are formed in the laminates, and the copper claddings except their circuit-corresponding portions are removed by etching. This conventional process is unfit for the fabrication of fine, high-density circuits because the application of copper electroplating results in large variation in plating thickness and the dimensional accuracy of circuits depends upon both the exactness of etching-resist formation and the exactness of copper etching. Therefore, various methods have been proposed for the fabrication of finer, higher-density circuits.

One of these methods is the chemical (electroless) copper plating pattern (selective electroless copper plating of conductive patterns) process. In this process, copper-clad laminates are used, the copper claddings except their predetermined circuit forming portions are masked with a photosensitive plating-resist, the non-masked portions of copper claddings are selectively chemical-plated with copper, the plating-resist is then removed, and the unmasked portions, i.e. the copper claddings except their predetermined circuit forming portions are removed, thereby making up circuits.

However, this process still involves the problem that the plating-resist is liable to peel off during the copper plating hence the formation of good circuits being impossible. This resist peeling is remarkable in the chemical copper plating, which gives little variation in the thickness of plating. In the copper electroplating, the resist peeling is limited, raising no significant problem in many case. That is whereas the copper electroplating proceeds quickly and is finished in a short time (in one hour), the chemical copper plating, proceeding slowly, requires a long time. for instance, the chemical copper plating to a thickness of 30 μm requires from 20 to 30 hours, which are at least 10-fold as long as the time required for the copper electroplating. The plating of such long duration damages the plating-resist. For example, it is said (IBM J. RES. DEVELOP, Vol. 29, No. 1 (1985), Cathodic delamination of methyl methacrylate-based dry film polymers on copper) that a portion of the chemical copper plating solution permeates along the interface between the plating-resist and the conductive substrate or through the resist film, and causes the following reaction:

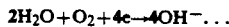

$$2H_2O + O_2 + 4e \rightarrow 4OH^- \ldots \quad (1)$$

at the interface, forming hydroxy ions; which result in the rupture of interfacial bond. In particular, the chemical copper plating bath, having an alkalinity as high as about 12 in pH, tends to cause the interfacial destruction.

In order to solve the above noted problem, a measure is proposed which, as described in the above IBM journal, comprises polishing the surface of copper cladding with pumice or the like to smooth the surface, and treating the polished surface with benzotriazole or some other reagent, followed by applying a photosensitive plating-resist to mask the copper cladding except its predetermined circuit forming portion. About the case where copper electroplating is employed instead of chemical copper plating, Japanese Patent Publication No. Sho. 50-9177 proposes the measure of adding benzotriazole or the like to a photosensitive plating-resist. These measures have greatly overcome the problem of the plating-resist delamination from substrates.

Sometimes, the use of benzotriazole as stated above achieves insufficient effect or in the chemical copper plating, produces adverse effects on plating performance. More specifically, the presence of benzotriazole may lower the rate of plating locally or throughout the whole plating surface and/or may result in plating films of inferior properties. This is assumed to be caused by the elusion of benzotriazole into the chemical copper plating solution. When such adverse effects are produced, no sufficiently reliable circuit will be obtainable or in certain cases the circuit formation itself will be impossible. It is considered that the proper control of benzotriazole concentrations in the resist and on the substrate surface is indispensable in order to preclude such difficulties as stated above, but in practice this control is difficult.

SUMMARY OF THE INVENTION

An object of the present invention is to provide a process for producing printed circuit boards which is an improvement of the chemical copper plating pattern process employing copper-clad insulating boards, wherein the plating-resist adheres securely to the substrative metal layers, whereby fine circuits can be formed without causing the delamination of plating-resist during the chemical copper plating.

The above and other objects of the present invention can be achieved with each of the following processes:

(1) A process for producing printed circuit boards which comprises the steps of (a) roughening a surface of a copper layer formed on an insulating board, (b) coating the roughened surface of copper layer with a photo-resist layer containing a sublimable copper-corrosion inhibitor, exposing the resist layer selectively to actinic rays according to the circuit pattern to form, and developing the resulting resist, thereby forming plating-resist coats on circuit-negative pattern portions of the copper layer, that is, on portions of the copper layer which form no circuit, (c) heat-treating the plating-resist coats, (d) plating chemically the circuit-corresponding portion with copper, (e) removing the plating-resist coats, and (f) removing the copper layer except the circuit-corresponding portion thereof.

(2) A process for producing printed circuit boards which comprises the steps of (a) roughening a surface of a copper layer formed on an insulating board, and covering the roughened surface with a thin film of metal having a more negative reduction potential of oxide than that of copper, (b) coating the thin metal film surface with a photo-resist layer containing a sublimable copper-corrosion inhibitor, exposing the resist layer selectively to actinic rays according to a circuit pattern to form, and developing the resulting resist, thereby forming plating-resist coats on circuit-negative pattern portions of the thin metal film, (c) heat-treating the plating-resist coats, (d) plating chemically the circuit-corresponding portion with copper, (e) removing the plating-resist coats, and (f) removing the thin metal film and the copper layer except their circuit-corresponding portions.

(3) A process for producing printed circuit boards which comprises the steps of (a) roughening a surface of a copper layer formed on an insulating board, and oxidizing and then reducing the roughened surface of copper layer, (b) coating the thus treated surface of copper layer with a photo-resist layer containing a sublimable copper-corrosion inhibitor, exposing the resist layer selectively to actinic rays according to a circuit pattern to form, and developing the resulting resist, thereby forming plating-resist coats on circuit-negative pattern portions of the copper layer, (c) heat-treating the plating-resist coats, (d) plating chemically the circuit-corresponding portion (e) removing the plating-resist coats, and (f) removing the copper layer except the circuit-corresponding portion thereof.

(4) A process for producing printed circuit boards which comprises the steps of (a) roughening a surface of a copper layer formed on an insulating board, oxidizing and then reducing the roughened surface of copper layer, and covering the thus treated surface with a thin film of metal having a lower normal electrode potential than that of copper, (b) coating the thin metal film surface with a photo-resist layer containing a sublimable copper-corrosion inhibitor, exposing the resist layer selectively to actinic rays according to a circuit pattern to form, and developing the resulting resist, thereby forming plating-resist coats on circuit-negative pattern portions of the thin metal film, (c) heat-treating the plating-resist coats, (d) plating chemically the circuit-corresponding portion with copper, (e) removing the plating-resist coats, and (f) removing the thin metal film and the copper layer except their circuit-corresponding portions.

(5) A process for producing printed circuit boards as set forth in any of the above items (1)–(4), wherein the sublimable copper-corrosion inhibitor is selected from benzotriazole, methylbenzotriazole, benzoguanamine, guanidine, 1-cyanoguanidine, thiazole, thiourea, 2-quinolylamine, 1,1'-azonaphthalene, dicyclohexylamine nitrite, diisopropylammonium benzoate, cyclohexylamine benzoate, and dicyclohexylammonium cyclohexane-carboxylate.

(6) A process for producing printed circuit boards as set forth in any of the above items (1)–(5), wherein the heating of plating-resist coats is conducted at a temperature where no deformation of the resist coats takes place.

(7) A process for producing printed circuit boards as set forth in any of the above items (1)–(5), wherein the heating of plating-resist coats is conducted at a temperature of 100° to 180° C. for a period of 1 to 2 hours.

(8) A process for producing printed circuit boards as set forth in any of the above items (1)–(4), wherein the removal of the copper layer and the thin metal film except their circuit-corresponding portions, in the step (f), is carried out after the copper circuit pattern has been covered with a etching-resist layer.

DETAILED DESCRIPTION OF THE INVENTION

Figure 1A:
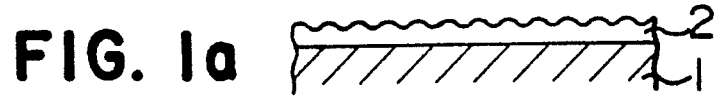
FIG. 1 is a diagram showing the steps of process for producing printed circuit boards which is an embodiment of the present invention.

A feature of the present invention is to roughen surfaces of copper layers formed on insulating boards. Another feature of the invention is to incorporate a sublimable copper-corrosion inhibitor into photosensitive plating-resist coats on the circuit-negative pattern portions of the roughened surfaces. A further feature of the invention is to heat the plating-resist coats before copper circuits are formed by chemical copper plating.

Conventionally, it has been regarded as a point to make such copper layer surfaces smooth as far as possible. Polish with pumice is known as a method for the smoothing. However, such smoothing methods are unsatisfactory to achieve the sufficient adhesion of plating-resist coats laminated on copper layers. Good results have been obtained by roughening rather than smoothing copper layer surfaces. It is considered that the roughening increases the contact surface area between the copper layer and the plating-resist and additionally produces anchor effect, thereby the adhesion being improved.

Further it has been found that when a thin layer of nickel, zinc, tin, or certain other metal is formed on the roughened surface of copper layer, the adherence of plating-resist to the substrate is much improved and the resist coats are kept stable without delamination during the chemical copper plating. From results of investigating the delamination of plating-resist during the plating, it can be considered that said good adherence of plating-resist is caused by a superficial oxide film which, covering said thin metal layer, is not reduced by the plating solution that has penetrated to the interface. That is, it is assumed that oxides of metals such as nickel, zinc, and tin, because the reduction potentials of these metal oxides are more negative than the reaction potential of the chemical copper plating solution, are retained without undergoing reduction and hence the bond between the plating-resist and the thin metal layer will not be split.

As stated above, the present invention is featured in that the process thereof includes the step of forming a photo-resist layer containing a sublimable copper-corrosion inhibitor, exposing the photo-resist layer to actinic rays, and developing the photo-resist layer to form plating-resist coats on the substrate portions (negative pattern portions) other than the predetermined circuit forming portion of the substrate and the step of heat-treating the plating-resist coats. It has been confirmed that when a photo-resist containing benzotriazole is used as a resist to chemical copper plating, the delamination of resist is reduced to a great extent as in the copper electroplating. But, the addition of benzotrizole, as stated before, raises the problems of inferior properties of copper films formed by chemical plating and lower rates of plating and the optimum amount of benzotriazole to add is difficult to determine. Hence, it has been substantially impossible to realize the addition of benzotriazole. In particular, when the chemical plating is repeated by using a copper plating solution without exchanging it or when the surface area of plating-resist coat is large, benzotriazole is eluted into the plating solution and accumulated therein, and eventually the plating becomes substantially impossible.

As a result of extensive investigations, the present inventors have found that copper-corrosion inhibiting substances other than benzotriazole, when incorporated into photosensitive plating-resists, are effective, similarly to benzotriazole, in preventing the delamination of resist coats. However, it has also been found that these other copper-corrosion inhibitors, similarly to benzotriazole, eluted into the chemical, copper plating solution, lowers the rate of plating and/or results in deteriorated plating film properties. Further investigations made thereupon have revealed that th contamination of the chemical copper plating solution and the delamination of plating-resist coats can be prevented simultaneously by forming resist coats containing a sublimable copper-corrosion inhibitor and then heating the resist coats. Based on this finding, the present invention has been accomplished.

It is conceivable that the heat treatment may sublime a part of the sublimable copper-corrosion inhibitor, leaving a proper amount thereof in the resist coat, thereby achieving said favorable effects. Presumably, the concentration of copper-corrosion inhibitor remaining in the resist coats has such a gradient as to be higher on the copper layer side and lower on the plating solution side.

According to the above described manner of carrying out the present invention, fine circuit patterns can be formed without suffering the problem of resist coat delamination under much severer conditions of chemical copper plating than those of copper electroplating and with less contamination of the chemical copper plating solution, the life of which is markedly prolonged.

Referring now to FIG. 1, the present invention is described more specifically.

FIG. 1 (a) shows the surface-roughened state of a copper layer 2 sticked on an insulating board 1. Materials adaptable for the insulating board 1 include glass epoxy laminates, glass polyimide laminates, and ceramic boards. Usual copper-clad laminate can be used as the copper layer 2 and the insulating board 1. Thinner copper layers are favorable for fine circuit fabrication. The surface of copper layer 2 can be roughened by mechanical methods such as sandblasting or chemical methods using solutions such as aqueous cupric chloride solutions acidified with hydrochloric acid. An effective method for further roughening the s rface is to treat it with an aqueous sodium chlorite solution or the like and subsequently with an aqueous dimethylamino borane solution or the like. In this invention, the copper surface is once oxidized to form copper (II) oxide, which is then reduced to metallic copper, whereby the surface is roughened, forming fine projections and depressions (Japanese Patent Application Kokai No. Sho 61-176192).

Figure 1B:
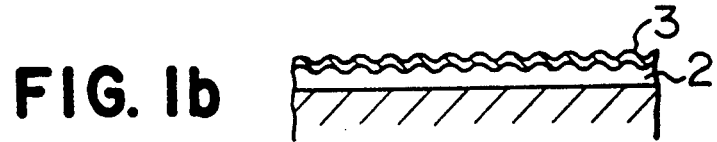

For the purpose of securing the adhesion of plating-resist during the plating, it is preferable to conduct such oxidation and reduction treatments of the copper surface. When better adhesion is required for plating-resist coats, a thin metal film 3 is formed on the roughened copper surface as shown in FIG. 1b. Preferred metals are of the type having a more negative oxide film reduction potential than the reaction potential of the chemical copper plating solution Particularly metals fitted for this film 3 are nickel, zinc, chromium, tin, and alloys of these metals. Particularly. While FIG. 1 shows the fabrication of single-sided printed circuit boards, the present process is adaptable for the fabrication of double sided or multilayer printed circuit boards. In this case, plating of through holes can be carried out as occasion demands.

Figure 1C:
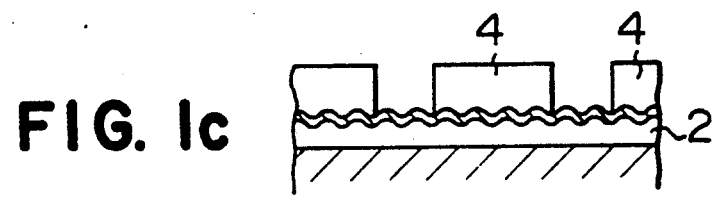

After roughening of the copper layer surface, the copper layer except the predetermined circuit forming portion thereof is masked with a plating-resist 4 as shown in FIG. 1c. This plating-resist may be a negative type photo-resist containing a sublimable copper-corrosion inhibitor. Suitable photo-resists for use in the present invention include photo-polymerizable unsaturated compounds having a ethylenic unsaturated bond at terminals (vinyl or isopropenyl groups). Examples of such unsaturated compounds are acrylic esters and methacrylic esters of polyhydric alcohols such as trimethylolpropane, trimethyhlolethane, propylene glycol, and tetraethylene glycol.

Examples of the sublimable copper-corrosion inhibitor include benzotriazole, methylbenzotriazole, benzoguanamine, guanidine, 1-cyanoguanidine, thiazole, thiourea, 2-quinolylamine, 1,1'-azonaphthalene, dicyclohexylamine nitrite, cyclohexylaminobenzoate, diisopropylammonium benzoate, and dicyclohexylammonium cyclohexane-carboxylate. Suitable contents of the sublimable copper-corrosion inhibitor in the photoresist depend upon the kind of inhibitor itself and conditions of the after-heating. In the case of benzotriazole, the suitable contents thereof are from 0.01 to 1 part by weight per 100 parts by weight of the photoresist and the after-heating is desirably carried out at a temperature of 100° to 160° C. for a period of 1 to 2 hours. It is desirable to add the copper-corrosion inhibitor in such an amount that the performance characteristics of the photo-resist may not be impaired as far as possible by the inhibitor.

The photosensitive plating-resist is laminated in film form on the roughened surface stated above by the common method. The lamination of resist film is followed by removing its portion laid on the predetermined circuit portion of the substrate. In general, this photoengraving is carried out in the manner that said circuit-corresponding portion of the photo-resist is masked, the non-masked portions are exposed to actinic rays, and the photo-resist coat is developed by using a liquid developer such as Chlorothene. In this case, excessive exposure may raise problems such that the exposed resist is difficult to remove in a later step and that the object of the present invention cannot be achieved sufficiently. Proper quantities of light for the exposure depend upon the kinds of light source and resist. When an ultra high pressure mercury lamp is used as a light source, the proper light quantities are up to 300 mJ/cm$^2$.

In the next place, the after-heating is car ied out. Suitable conditions of this after-heating depend upon the kind and amount of copper-corrosion inhibitor contained in the photosensitive plating-resist. The after-heating is conducted desirably at a temperature where the patterned resist does not deform or undergo denaturation. In many cases the after-heating temperature is up to 180° C. This after-heating sublimes an excess of the copper-corrosion inhibitor to remove it, whereby such a distribution of the inhibitor concentration as sated above (the concentration is higher on the copper layer side and lower on the outer side) is presumably formed (the concentration measurement is not made).

Figure 1D:
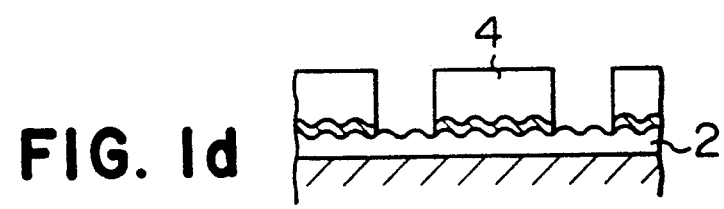

When the thin metal layer 3 has been formed, the circuit-corresponding portion thereof is then removed, as shown in FIG. 1d, as occasion demands. Most of the liquids which dissolve the metal layer 3 can be used for this removal.

Figure 1E:
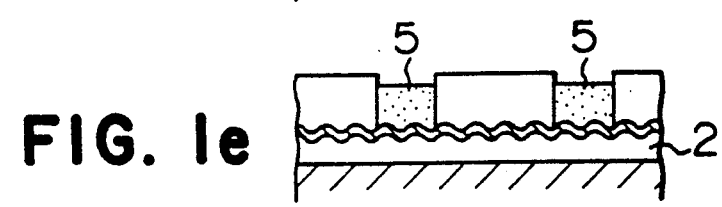

Thereafter the circuit-corresponding portion of copper layer is plated chemically with copper 5 as shown in FIG. 1e. For this chemical copper plating, usual thick-plating solutions are adaptable. When through holes are chemically plated with copper, it is desirable to form a plating film of specially high quality. High quality plating films superior in elongation and other properties can be obtained by plating at 70° C. for several to tens of hours using, for example, a chemical copper plating solution of the following composition:

| | |
|---|---|
| $CuSO_4$ | 0.04 M |
| Ethylenediaminetetracetic acid (EDTA) | 0.08 M |
| HCHO | 0.03 M |
| NaOH | quantity to give pH 12.6 |
| 2,2'-dipyridyl | 30 mg/l |
| Polyethylene glycol | 10 g/l |

Figure 1F:
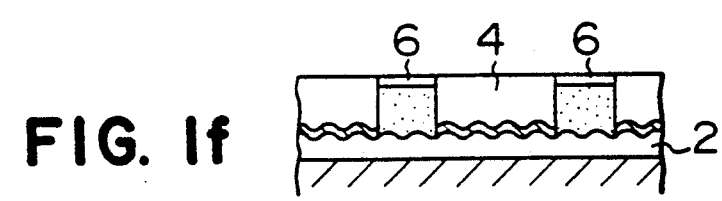

After completion of the chemical copper plating, a solder plating 6, which serves as an etching resist for copper, is formed on the copper plating as shown in FIG. 1f. However, this plating is not necessary formed of solder but may be formed of gold, nickel, or some other metal. If this etching resist for copper is not formed, the copper layer portion to form the intended circuit will be partly removed by the copper etching (to remove the unnecessary portions of the copper layer) in a later step. Hence the etching resist 6 for copper is preferably formed, When the etching resist for copper is formed of a solder plating, generally-used fluoroborate plating solutions are available.

Figure 1G:
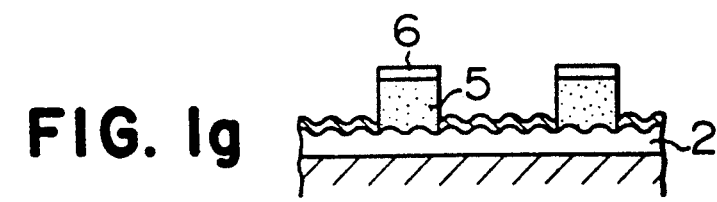

After completion of the solder plating, the photo-resist coats 4 are removed as shown in FIG. 1g. Since this step of removing the photo-resist coats is indispensable in the present invention, it is desirable to omit the after-exposure that is effective for accelerating the hardening of the resist after development. common peeling liquids such as methylene chloride may be used for the removable of resist coats.

Figure 1H:
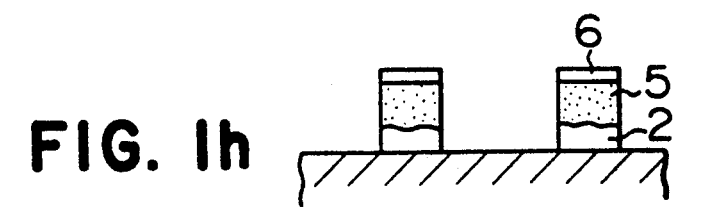
Figure 1I:
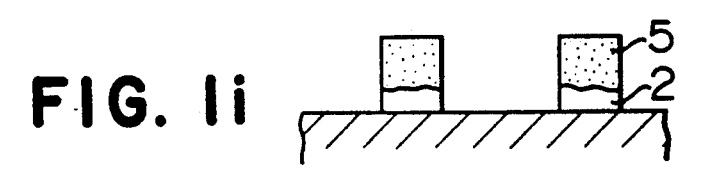

After the photo-resist coats have been removed, the copper layer 2 except its portion serving as the intended circuit is removed by etching as shown in FIG. 1h. When the metal layer 3 is formed previously, the unnecessary portions thereof are removed similarly. Finally, the solder plating 6k, which is an etching resist for copper, is removed as shown in FIG. 1i. However, when this removal is unnecessary, the operation may be ended with the state of FIG. 1h left as such. In particular, when the etching resist for copper is formed of a gold plating, it is after left as such without removal.

It is possible by carrying out the above desoribed process to fabricate a printed circuit board having a fine circuit pattern without causing any defect in the adherence of plating-resist coats to the substrate during the chemical copper plating and without substantial contamination of the chemical copper plating solution.

DESCRIPTION OF THE PREFERRED EMBODIMENTS

The present invention is illustrated in more detail with reference to the following examples.

EXAMPLE 1

Step a: Through holes were drilled at necessary positions of a glass epoxy laminate having on either side thereof a 18-μm thick copper cladding. Then the copper surfaces were polished by brushing, degreased with alkali, washed with water, and treated with a soft etching solution at 30° C. for 1 minute. The etching solution was previously prepared by dissolving 200 g of ammonium persulfate and 10 ml of sulfuric acid in water to give a whole volume of 1 l. After washing, the laminate was dipped in 15% hydrochloric acid for 1 minute and then in a catalyst liquid (tradename: HS101B, supplied by Hitachi Kasei Kogyo Co., Ltd.) at 20° C. for 5 minutes, washed with water, further dipped in 15% hydrochloric acid at 230° C. for 5 minutes, and washed with water, thus activating both the surfaces. Subsequently, the laminate was plated with copper in a chemical plating solution of the following composition (I) at 70° C. for 2 hours.

| Composition (I) | |
|---|---|
| $CuSO_4.5H_2O$ | 10 g/l |
| Disodium ethylenediaminetetra-acetate dihydrate | 30 g/l |
| Formalin (37%) | 3 ml/l |
| NaOH | Amount to give pH 12.6 |
| 2,2'-Dipyridyl | 30 mg/l |
| Polyethylene glycol (average molecular weight 600) | 10 g/l |

The through holes drilled in the plated laminate at necessary positions were also plated by the above chemical copper plating to connect electrically the both side copper layers to each other.

Step b: To roughen the surface of each copper layer, the copper-clad laminate was dipped in a solution of the following composition (II) with stirring by aeration at 45° C. for 30 seconds.

| Composition (II) | |
|---|---|
| $CuCl_2.2H_2O$ | 40 g/l |
| HCl (36%) | 500 ml/l |

Then the plating surface was washed with water, thus preparing a surface-roughened base board.

Step c: The surface of base board was thoroughly dried. On the other hand, a photosensitive resin solution of the following composition (III) was applied uniformly on a 25-μm thick polyethylene terephthalate film, and the coating was dried in a hot air convection type oven of 80° C. for 10 minutes.

| Composition (III) | part by weight |
|---|---|
| Trimethylolpropane triacrylate | 20 |
| Tetraethylene glycol diacrylate | 20 |
| Polymethyl methacrylate (weight average molecular weight about 120,000) | 60 |
| Benzophenone | 6 |

-continued

| Composition (III) | part by weight |
| --- | --- |
| 4,4'-Bis(diethylamino)benzophenone | 0.1 |
| Benzotriazole | 0.1 |
| Victoria Pure Blue | 0.05 |
| Hydroquinone | 0.1 |
| Methyl ethyl ketone | 100 |
| Toluene | 50 |

The above coating was controlled to give a 35-μm thick layer of photosensitive resin composition after drying. An about 25-μm thick polyethylene film was sticked as a cover film on the photosensitive resin composition layer to prepare a photosensitive film supported by PET film and covered with PE Film to become subsequently a plating-resist. After the cover film was separated from the element, the remainder was laminated on both sides of the above prepared base board by using a hot roll laminator. This lamination was conducted continuously at a hot roll temperature of 110° C. and a lamination speed (speed of stock traveling) of 1 m/min. After the resulting laminate was allowed to cool for about 5 minutes, its predetermined circuit forming portion was masked, and the other portions were exposed to 100 mJ/cm$^2$ of light from an ultra high pressure mercury lamp. Then the development was made by spraying 1,1,1-trichloroethane as a developer at about 18° C. for 2 minutes. Thus, the copper layers (on both sides of glass epoxy laminate) except their predetermined circuit forming portion were masked with plating-resist coats. In this example a 90 μm thick circuit pattern was formed on either side of the base board.

Step d: After the copper layers except their predetermined circuit forming portion have been masked with plating—resist coats, thermal treatment was conducted at 140° C. for 1 hour.

Step e: The whole of the substrate was immersed in an aqueous solution of sulfuric acid of 100 ml/l for 2 minutes to remove oxides, etc., and then washed with water.

Step f: The cleaned board was immersed in a chemical copper plating solution of the same composition as composition (I) in step (a) at 70° C. for 12 hours, thereby being plated with a pattern of copper. After plating, the board was thoroughly washed with water.

Step g: The resulting board was dipped in an aqueous solution of sulfuric acid (100 ml acid/l solution) for 2 minutes, and further immersed in a solder plating bath containing 15 g/l of sn$^{2+}$, 10 g/l of Pb$^{2+}$, 40 g/l of H$_3$BO$_3$, and 300 g/l of HBF$_4$ with stirring for 25 minutes while supplying an electric current at 1A/dm$^2$, thereby plating the copper plating pattern with solder. The board was then washed thoroughly with water and dried.

Thus a double sided printed circuit board having plated through holes was made up by operating steps a through h in succession.

EXAMPLE 2

A double sided, through holed, printed circuit board was fabricated according to the procedure of Example 1 except that the following step i was added between steps b and c.

Step i: To roughen further the surface of each copper layer, the base board was dipped in a treating solution of the following composition (IV) at 70° C. for two minutes, thereby oxidizing the copper layer surface.

| Composition (IV) | |
| --- | --- |
| NaClO$_2$ | 100 g/l |
| Na$_3$PO$_4$ | 30 g/l |
| NaOH | 12 g/l |

After washing with water, the base board was dipped in a treating solution of the following composition (V) at 45° C. for 1 minute to reduce the oxide. Thereby the copper layer surface was roughed sufficiently. The base board was then washed thoroughly.

| Composition (V) | |
| --- | --- |
| Dimethylaminoborane | 10 g/l |
| NaOH | 10 g/l |

EXAMPLE 3

A double sided, through holed, printed circuit board was fabricated according to the procedure of Example 1 except that the following step j was operated instead of step b.

Step j: To roughen the surface of each copper layer, the copper-clad laminate was subjected successively to; dipping in an aqueous solution containing 200 g/l of ammonium persulfate and 5 ml/l of sulfuric acid with stirring at 30° C. for 1 minute; washing with water; dipping in a treating solution of composition (IV), as shown in step i of Example 1, at 70° C. for 2 minutes; ashing with water; dipping in a treating solution of composition (V), as shown in Step i of Example 1, at 45° C. for 1 minute to reduce the oxide; washing with water; plating in a nickel plating solution of the following composition (VI) at 20° C. and 0.1 A/dm$^2$ for 6 minutes, thereby forming a thin nickel layer on the surface of each copper layer; and to sufficient washing with water.

| Composition (VI) | |
| --- | --- |
| NiSO$_4$.6H$_2$O | 200 g/l |
| NaCl | 15 g/l |
| H$_3$BO$_3$ | 15 g/l |

EXAMPLE 4

A double sided, through holed, printed circuit board was fabricated according to the procedure of Example 3 except that the content of benzotriazole in the photosensitive resin solution of composition (III) used in step c was changed to 0.02 part by weight and that the heat treatment in step d was conducted at 100° C. for 2 hours.

EXAMPLE 5

A double sided, through holed, printed circuit board was fabricated according to the procedure of Example 3 except that the content of benzotriazole in the photosensitive resin solution of composition (III) used in step c was changed to 0.5 part by weight and that the heat treatment in step d was conducted at 160° C. for 2 hours.

EXAMPLE 6

A double sided, through holed, printed circuit board was fabricated according to the procedure of Example 3 except that in step j, zinc electroplating was conducted by using a zinc plating solution (Schering bath, supplied by Jincalux Co.) instead of the nickel plating solution at 0.5 A/dm$^2$ for 5 minutes.

EXAMPLE 7

A double sided, through holed, printed circuit board was fabricated according to the procedure of Example 3 except that the composition (III) of the photosensitive resin solution used in step c was changed to the following composition (VIII) and that the heat treatment in step d was conducted at 150° C. for 1 hour.

| Composition (VIII) | Part by weight |
|---|---|
| Trietoxidized trimethylolpropane triacrylate (tradename: Acryl Monomer SR-454, supplied by Sartomer Co.) | 40 |
| Methyl methacrylate/ethyl acrylate/dimethylaminoethyl methacrylate (97/2/1 weight ratio) copolymer (weight average molecular weight about 100,000) | 60 |
| Benzophenone | 6 |
| 4,4'-Bis(diethylamino)benzophenone | 0.1 |
| Benzoguanamine | 0.2 |
| Leuco Crystal Violet | 0.3 |
| Tribromomethylphenyl sulfone | 0.3 |
| Victoria Pure Blue | 0.03 |
| Hydroquinone | 0.1 |
| Methyl ethyl ketone | 100 |
| Toluene | 50 |

EXAMPLE 8

A double sided, through holed, printed circuit board was fabricated according to the procedure of Example 7 except that 0.02 part by weight of 1-cyanoguanidine was used instead of benzoguanamine in the photosensitive resin solution of composition (VIII).

EXAMPLE 9

A double sided, through holed, printed circuit board was fabricated according to the procedure of Example 7 except that 1 part by weight of 2-quanolylamine was used instead of benzoguanamine in the photosensitive resin solution of composition (VIII) and that the heat treatment in step d was conducted at 130° C. for 1 hour.

EXAMPLE 10

A double sided, through holed, printed circuit board was fabricated according to the procedure of Example 7 except that 5 parts by weight of cyclohexylamine benzoate was used instead of benzoguanamine in the photosensitive resin solution of composition (VIII) and that the heat treatment in step d was conducted at 130° C. for 1 hour.

Results of Examples 1–10 together with those of the following comparative examples are summarized in Table 1. As are evident from Table 1, good results were obtained in all of Examples 1–10.

Comparative Example 1

A double sided, through holed, printed circuit board was fabricated according to the procedure of Example 3 except that benzoytriazole was not incorporated into the photosensitive resin solution of composition (III) used in step (c) and that the heat treatment in step d was omitted.

Comparative Example 2

A double sided, through holed, printed circuit board was fabricated according to the procedure of Example 3 except that the heat treatment in step d was omitted.

Comparative Example 3

A double sided, through holed, printed circuit board was fabricated according to the procedure of Example 3 except that benzoytriazole was not incorporated into the photosensitive resin solution of composition (III) used in step c.

Comparative Example 4

A double sided, through holed, printed circuit board was fabricated according to the procedure of Example 3 except that the formation of thin metal film in step j was omitted.

TABLE 1

| | | Roughening | Metal film | Photo-resist coat | | | After heat treatment | |
|---|---|---|---|---|---|---|---|---|
| | | | | Base composition | Copper-corrosion inhibitor | | Temperature (°C.) | Period (hr) |
| | | | | | Chemical name | Content (part by wt) | | |
| Example No. | 1 | Composition (II) | — | Composition (III) | Benzotriazole | 0.1 | 140 | 1 |
| | 2 | Compositions (II), (IV), (V) | — | Composition (III) | Benzotriazole | 0.1 | 140 | 1 |
| | 3 | Ammonium persulfate compositions (IV) (V) | Ni | Composition (III) | Benzotriazole | 0.1 | 140 | 1 |
| | 4 | Ammonium persulfate compositions (IV) (V) | Ni | Composition (III) | Benzotriazole | 0.02 | 100 | 2 |
| | 5 | Ammonium persulfate compositions (IV) (V) | Ni | Composition (III) | Benzotriazole | 0.5 | 160 | 2 |
| | 6 | Ammonium persulfate compositions (IV) (V) | Zn | Composition (III) | Benzotriazole | 0.1 | 140 | 1 |
| | 7 | Ammonium persulfate compositions (IV) (V) | Ni | Composition (VIII) | Benzoguanamine | 0.2 | 150 | 1 |
| | 8 | Ammonium persulfate compositions (IV) (V) | Ni | Composition (VIII) | 1-Cyanaguanidine | 0.02 | 150 | 1 |
| | 9 | Ammonium persulfate compositions (IV) (V) | Ni | Composition (VIII) | 2-Qunolyamine | 1 | 130 | 1 |
| | 10 | Ammonium persulfate compositions (IV) (V) | Ni | Composition (VIII) | Cyclohexylamine benzoate | 5 | 130 | 1 |
| Comparative | 1 | Ammonium persulfate compositions (VI) (V) | Ni | Composition (III) | — | — | — | — |

TABLE 1-continued

| Example No. | 2 | Ammonium persulfate compositions (IV) (V) | Ni | Composition (III) | Benzotriazole | 0.1 | — | — |
|---|---|---|---|---|---|---|---|---|
| | 3 | Ammonium persulfate compositions (IV) (V) | Ni | Composition (III) | — | — | 140 | 1 |
| | 4 | — | — | Composition (III) | Benzotriazole | 0.1 | 140 | 1 |

| | | | Adherence of resist coat during plating (degree of delamination)*1 | Rate of*2 plating (μm/h) | Elongation*3 of plating film (%) |
|---|---|---|---|---|---|
| Example No. | | 1 | Generally good (2%) | 2.9 | 5.7 |
| | | 2 | Generally good (2%) | 3.1 | 4.8 |
| | | 3 | Good (up to 1%) | 3.1 | 6.3 |
| | | 4 | Good (up to 1%) | 3.0 | 7.4 |
| | | 5 | Good (up to 1%) | 2.8 | 4.9 |
| | | 6 | Good (up to 1%) | 2.9 | 5.3 |
| | | 7 | Good (up to 1%) | 2.8 | 6.0 |
| | | 8 | Good (up to 1%) | 3.0 | 7.1 |
| | | 9 | Generally good (2%) | 3.1 | 7.7 |
| | | 10 | Generally good (2%) | 3.2 | 7.9 |
| Comparative Example No. | | 1 | Slightly bad (20%) | 3.1 | 5.1 |
| | | 2 | Good (up to 1%) | 1 or below | 1 or below |
| | | 3 | Bad (30%) | 3.0 | 6.3 |
| | | 4 | Bad (30%) | 3.1 | 6.8 |

Notes
*1 Degree of delamination = Ratio (%) of delamination area to whole interfacial area of resist coat.
*2 Rate of plating = Average value = Final thickness of plating/plating type period (the plating thickness was measured with a coulometric thickness tester).
*3 Elongation of plating film applied on stainless steel sheet (the plating film was gradually peeled from the stainless steel sheet by using a tensile tester and the elongation at break was measured with the tester).

Effect of the Invention

According to the present invention; photosensitive plating-resist coats good in adherence to substrates and hence free from delamination during chemical copper plating can be obtained and substantially no copper-corrosion inhibitor is eluted from the plating-resist coats into chemical copper plating solutions; hence good chemical copper plating patterns can be formed without causing drop in the rate of plating or deterioration of plating film properties. Thus the process of the present invention is much effective in the fabrication of fine circuit patterns.

What is claimed is:

1. A process for producing printed circuit boards which comprises the steps of
   (a) roughening a surface of a copper layer formed on an insulating board,
   (b) coating the roughed surface of copper layer with a photo-resist layer containing a sublimable copper-corrosion inhibitor, exposing the resist layer selectively to actinic rays according to a circuit pattern to form, and developing the resulting resist, thereby forming plating-resist coats on circuit-negative pattern portions of the copper layer,
   (c) heat-treating the plating-resist coats,
   (d) plating chemically the circuit-corresponding portion with copper,
   (e) removing the plating-resist coats, and
   (f) removing the copper layer except the circuit-corresponding portion thereof.

2. The process of claim 1, wherein the sublimable copper corrosion inhibitor is selected from the group consisting of benzotriazole, methylbenzotriazole, benzoguanamine, guanidine, 1-cyanoguanidine, thiazole, thiourea, 2-quinolylamine, 1,1'-azonaphthalene, dicyclohexylamine nitrite, diisopropylammonium benzoate, cyclohexylamine benzoate, and dicyclohexylammonium cyclohexanecarboxylate.

3. The process of claim 1, wherein the heat treatment in the step (c) is conducted at a temperature where the plating-resist coats do not deform.

4. The process of claim 1, wherein the heat treatment in the step (c) is conducted at a temperature of 100° to 180° C. for a period of 1 to 2 hours.

5. The process of claim 1, wherein the removal of the copper layer except its circuit pattern portion, in the step (f) is carried out after the copper circuit pattern has been covered with a etching-resist layer.

6. A process for producing printed circuit boards which comprises the steps of
   (a) roughening of a copper layer formed on an insulating board, and covering the roughened surface with a thin film of metal having a more negative reduction potential of oxide than that of copper,
   (b) coating the thin metal film surface with a photoresist layer containing a sublimable copper-corrosion inhibitor, exposing the resist layer selectively to actinic rays according to a circuit pattern to form, and developing the resulting resist, thereby forming plating-resist coats on circuit-negative pattern portions of the thin metal film,
   (c) heat-treating the plating-resist coats,
   (d) plating chemically the circuit-corresponding portion with copper,
   (e) removing the plating-resist coats, and
   (f) removing the thin metal film and the copper layer except their circuit-corresponding portion.

7. The process of claim 6, wherein the sublimable copper-corrosion inhibitor is selected from the group consisting of benzotriazole, methylbenzotriazole, benzoguanamine, guanidine, 1-cyanoguanidine, thiazole, thiourea, 2-quinolylamine, 1,1'-azonaphthalene, dicyclohexylamine nitrite, diisopropylammonium benzoate, cyclohexylamine benzoate, and dicyclohexylammonium cyclohexanecarboxylate.

8. The process of claim 6, wherein the heat treatment in the step (c) is conducted at a temperature where the plating resist coats do not deform.

9. The process of claim 6, wherein the heat treatment in the step (c) is conducted at a temperature of 100° to 180° C. for a period of 1 to 2 hours.

10. The process of claim 6, wherein the removal of the copper layer and the thin metal film except their circuit pattern portions, in the step (f), is carried out after the copper circuit pattern has been covered with a etching-resist layer.

11. A process for producing printed circuit boards which comprises the steps of
    (a) roughening a surface of a copper layer formed on an insulating board, and oxidizing and then reducing the roughened surface of copper layer,
    (b) coating the treated surface of copper layer with a photo-resist layer containing a sublimable copper-corrosion inhibitor, exposing the resist layer selectively to actinic rays according to the circuit pattern to form, and developing the resulting resist, thereby forming plating-resist coats on circuit-negative pattern portion of the copper layer,
    (c) heat-treating the plating-resist coats,
    (d) plating chemically the circuit-corresponding portion with copper,
    (e) removing the plating-resist coats, and
    (f) removing the copper layer except the circuit-corresponding portion thereof.

12. The process of claim 11, wherein the sublimable copper-corrosion inhibitor is selected from the group consisting of benzotriazole, methylbenzotriazole, benzoguanamine, guanidine, 1-cyanoguanidine, thiazole, thiourea, 2-quinolylamine, 1,1'-azonaphthalene, dicyclohexylamine nitrite, diisopropylammonium benzoate, cyclohexylamine benzoate, and dicyclohexylammonium cyclohexanecarboxylate.

13. The process of claim 11, wherein the heat treatment in the step (c) is conducted at a temperature where the plating-resist coats do not deform.

14. The process of claim 11, wherein the heat treatment in the step (c) is conducted at a temperature of 100° to 180° C. for a period of 1 to 2 hours.

15. The process of claim 11, wherein the removal of the copper layer except its circuit pattern portion, in the step (f) is carried out after the copper circuit pattern has been covered with a etching-resist layer.

16. A process for producing printed circuit boards which comprises the steps of
    (a) Roughening a surface of a copper layer formed on an insulating board, oxidizing and then reducing the roughened surface of copper layer, and covering the treated surface with a thin film of metal having a normal negative reduction potential of oxide than that of copper,
    (b) coating the thin metal film surface with a photo-resist layer containing a sublimable copper-corrosion inhibitor, exposing the resist layer selectively to actinic rays according to a circuit pattern to form, and developing the resulting resist, thereby forming plating-resist coats on circuit-negative pattern portions of the thin metal film,
    (c) heat-treating the plating-resist coats,
    (d) plating chemically the circuit-corresponding portion with copper,
    (e) removing the plating-resist coats, and
    (f) removing the thin metal film and the copper layer except their circuit-corresponding portions.

17. The process of claim 16, wherein the sublimable copper-corrosion inhibitor is selected from the group consisting of benzoytriazole, tolyltriazole, benzoguanamine, guanidine, 1-cyanoguanidine, thiazole, thiourea, 2-quinolylamine, 1,1'-azonaphthalene, dicyclohexylamine nitrite, diisopropylammonium benzoate, cyclohexylamine benzoate, and dicyclohexylammonium cyclohexanecarboxylate.

18. the process of claim 16, wherein the heat treatment in the step (c) is conducted at a temperature where the plating-resist coats do not deform.

19. The process of claim 16, wherein the heat treatment in the step (c) is conducted at a temperature of 100° to 180° C. for a period of 1 to 2 hours.

20. the process of claim 16, wherein the removal of the copper layer and the thin metal film except their circuit pattern portions, in the step (f), is carried out after copper circuit pattern has been covered with a layer of etching-resist for copper.

21. The process of claim 1, wherein the heat-treating of the plating-resist coats is effected at a temperature and for a period of time sufficient to cause partial removal of the sublimable copper-corrosion inhibitor from the plating-resist coats whereby elution of the copper-corrosion inhibitor into a chemical plating solution for effecting the chemical plating with copper in step (d).

* * * * *